United States Patent [19]
Borel et al.

[11] 3,995,939
[45] Dec. 7, 1976

[54] METHOD FOR CONTROLLING AN OPTICAL CHARACTERISTIC OF A MATERIAL AND AN ANALOG IMAGER FOR CARRYING OUT SAID METHOD

[75] Inventors: Joseph Borel, Echirolles; Bruno Dargent, Grenoble; Guy Labrunie, Seyssinet; Jacques Robert, Saint-Engreve, all of France

[73] Assignee: Commissariat a l'Energie Atomique, Paris, France

[22] Filed: Jan. 28, 1975

[21] Appl. No.: 544,826

[30] Foreign Application Priority Data
Feb. 6, 1974 France .............................. 74.03980

[52] U.S. Cl. .................. 350/160 LC; 340/336; 340/324 M
[51] Int. Cl.² ................. G08B 5/36; G02F 1/18
[58] Field of Search ............. 350/160 LC; 346/336; 346/324 M; 328/59

[56] References Cited
UNITED STATES PATENTS 3,877,016  4/1975  Jorgensen ............... 350/160 LC

OTHER PUBLICATIONS

Ohtsuka, T., Tsukamoto, Tsuchiya, Tsuchiya M., "Liquid Crystal Matrix Display", Japanese Journal of Applied Physics, vol. 12, No. 3, Mar. 1973, pp. 371–378.
Lechner, B. J., Marlowe, F. J., Nestor, E. O., Tults, J., "Liquid Crystal Matrix Display", Proceedings of the IEEE, vol. 59, Nov. 1971, pp. 1566–1579.
Labrunie, G., Robert, J., Borel, J., "Nematic Liquid Crystal 1024 Bits Page Composer", Applied Optics, vol. 13, No. 6, June 1974, pp. 1355–1358.

*Primary Examiner*—John K. Corbin
*Assistant Examiner*—Rolf Hille
*Attorney, Agent, or Firm*—Cameron, Kerkam, Sutton, Stowell & Stowell

[57] ABSTRACT

A method for controlling an optical characteristic of a material which is intercalated between two electrodes driven by periodic excitation signals having a zero mean value consists in applying to the electrodes signals having the same time-duration and the same recurrence frequency but in which one signal has a phase shift $\phi$ with respect to the other, the phase shift being modified in order to adjust the optical characteristic.

16 Claims, 5 Drawing Figures

METHOD FOR CONTROLLING AN OPTICAL CHARACTERISTIC OF A MATERIAL AND AN ANALOG IMAGER FOR CARRYING OUT SAID METHOD

This invention relates to a method for controlling an optical characteristic of a material and to an analog imager for carrying out said method. The invention finds an application in the field of optoelectronics and mainly in the control of liquid crystal cells employed especially as converters for converting electrical information into optical information, in the treatment of optical images in real time, in the construction of colored filters which can be used primarily in color television, in analog displays.

Although it applies to materials of any shape or size, the invention is more especially concerned with the sequential control of a plurality of zones arranged in a matrix and intercalated in a so-called crossbar system. Systems of this type comprise a first family of $p$ parallel control lines and a second family of $q$ parallel control lines, the lines and the columns being in crossed relation, a zone $x_iy_j$ of the material being defined by the overlap region between the column $x_i$ (where $i$ is a whole number which can assume all the values between 1 and $q$) and the line $y_j$ (where $j$ is a whole number between 1 and $p$). The strips or "bars" formed by the lines and the columns are so designed as to be capable of carrying suitable signals for the excitation of the material.

There are many known devices of this type in which a liquid crystal film for example is used as sensitive material and in which the excitation is electrical. The invention is particularly well suited to devices of this type but applies more generally to any crossbar system formed of material having an optical characteristic which can be modified by means of any desired form of excitation. This excitation can be of an electrical nature such as liquid crystals but can also be magnetic, thermal, electronic and so forth. The material can be a substance which is solid or liquid, amorphous or crystalline. The optical characteristic can be an opacity, an index of refraction, a transparency, an absorption, a diffusion, a diffraction, a convergence, a rotatory power, a birefringence, an intensity reflected within a predetermined solid angle, and so forth.

Apart from liquid crystals, suitable materials can also consist of other crystals such as, for example, cadmium sulphide in which the front of the absorption band can be displaced by thermal effect. In this case, the controllable optical characteristic is the absorption of light and excitation is provided by heating. Another case can be noted in which the optical characteristic is the intensity of light reflected by a deformable membrane and in which said excitation is an electrostatic force.

There are many known method for binary control of an optical characteristic of a material which is incorporated in a device of the crossbar type. For example in the case of a liquid crystal cell in which the excitation is of an electrical type, the following methods are known. The first method consists in applying a potential $+V/2$ to the line $y_j$ and a potential $-V/2$ to the column $x_i$ whilst all the other bars are connected to ground. The potential difference between the bars at the point $x_i$ and $y_j$ is therefore equal to V. But the zones adjacent to the sensitized point are also subjected to a potential difference which is equal in this case to $V/2$.

The drawback of this method is that it results in a weak contrast between the sensitized point and adjacent points.

In order to increase said contrast, the bars $x_i$ and $y_j$ respectively can be brought to the potentials $-3V/2$ and $+3V/2$ whilst the other columns can be brought to the potential $+V/2$ and the other lines can be brought to the potential $-V/2$. The zone $x_i$ and $y_j$ is then subjected to a voltage equal to $3V$ and the adjacent zones are subjected only to a voltage V.

These methods of control are attended by a disadvantage in that they lead to accumulation effects in the zones adjacent to those which have been addressed. This effect is different from one point to another and is a function of the images which have previously been addressed. A method of control which makes this accumulation independent of the image displayed has recently been proposed. To this end, a signal $A_1$ is applied to column $x_i$ and a zero signal to the other columns, and there are applied in parallel with the lines $y_j$ signals $A_2$ which are in phase or in opposite phase with the signal $A_1$, depending on whether it is desired to display logical signals 0 or 1. If the material is such that the value of the optical characteristic is an even-numbered function of the excitation, it is accordingly shown that the accumulation effect is constant irrespective of the image reproduced.

The method just mentioned is the most elaborate but makes it possible to display only binary signals such as black or white, for example. If it were desired to vary the intensity of the displayed signal or if it were desired to display different levels of grey, for example, it would be necessary to vary the width of the excitation signals applied to the lines and the columns or the amplitude of these signals. But the effects of accumulation would again become variable as a function of the image displayed.

This invention is precisely directed to a method which permits analog control of the optical characteristic of a material without modifying the amplitude or the duration of the excitation signals. If so desired, the method as applied to a crossbar system can serve to make the accumulation effects constant irrespective of the image displayed.

The essential characteristic of the invention consists in making use of the excitation signals which are phase-shifted with respect to each other and in modifying said phase shift in order to adjust the characteristic of the material to the desired value, the amplitudes and time-durations of the excitation signals having been set at predetermined values as a function of the particular characteristics of the device employed.

In more precise terms, the present invention is directed to a method for controlling an optical characteristic of a material which is intercalated between two electrodes driven by periodic excitation signals having a zero mean value, the invention being distinguished by the fact that there are applied to said electrodes signals having the same time-duration and the same recurrence frequency but in which one signal has a phase shift $\phi$ with respect to the other and that said phase shift is modified in order to adjust said characteristic.

A further aim of the present invention is to provide a method of sequential control of an optical characteristic of a material constituting a plurality of zones arranged in a matrix and intercalated between a first family of $p$ parallel control lines and a second family of $q$ parallel control columns, the lines and the columns being in crossed relation, a zone $x_iy_j$ being defined by that region of the material which is covered by the column $x_i$, where $i$ is an integer $1 \leq i \leq q$, and by the line $y_j$, where $j$ is an integer $1 \leq j \leq p$, said lines and columns being employed to carry suitable signals for producing excitation of the material, said method being distinguished by the fact that, in order to control the characteristic of the material of the zone $x_iy_j$ at a value C, a signal $A_x$ is applied to the column $x_i$ and a zero signal is applied to the other columns and there is applied to the line $y_j$ a signal $A_y$ having the same duration and the same frequency as the signal $A_x$ but having a phase shift $\phi$ with respect to the signal $A_x$ and that said phase shift is modified in order to adjust the characteristic of the material within the zone $x_iy_j$ to the desired value.

When the characteristic of the material is an even-numbered function of the excitation, the method according to the invention makes it possible to produce constant accumulation in all the zones of the image. It would be possible in accordance with the invention to apply to lines other than $y_j$ a signal which is in phase with the signal $A_x$ throughout the time of application of the signal $A_y$ to the line $y_j$. This would permit writing of only one point at a time.

In a preferred mode of execution of the method of sequential control according to the invention, the value of the optical characteristic of all the zones of a given column $x_i$ is controlled simultaneously by applying simultaneously to each line the signal $A_y$ which corresponds thereto.

In yet another preferred mode of execution of the method according to the invention, the input quantity which it is desired to display by means of the optical characteristic of the material is quantized and $n$ discrete values between 0 and $\pi$ of the phase shift between the excitation signals are caused to correspond to the $n$ quantization levels employed. In this mode of execution, only these discrete values of the phase shift are employed, thus resulting in quantized display levels.

In a further mode of execution, a phase shift is caused to correspond to each value of the input quantity which it is desired to display and this is carried out by means of a method of amplitude-phase analog conversion. In this mode of execution, the analog display is a continuous function of the input quantity.

The present invention is also directed to an analog imager for the practical application of the method hereinabove defined. Said imager is of the type comprising a display cell constituted by a material intercalated between two electrodes driven by periodic excitation signals, said material being such as to have an optical characteristic which is dependent on said excitation, and means for delivering said excitation signals to said electrodes, the imager being distinguished by the fact that said means comprise means for delivering excitation signals having the same recurrence frequency and the same duration but having a phase shift $\phi_{ji}$ with respect to each other and means for causing a value of said phase shift $\phi_{ji}$ to correspond to any value G of an input quantity to be displayed.

In a preferred embodiment, the imager according to the invention is of the type comprising a plurality of zones arranged in a matrix and intercalated between a first family of $p$ parallel control lines and a second family of $q$ parallel control columns, the lines and the columns being in crossed relation, a zone $x_iy_j$ being defined by the extent of overlap of the column $x_i$ where $i$ is an integer between 1 and $q$, and of the line $y_j$ where $j$ is an integer between 1 and $p$, said lines and columns being connected to suitable sequential excitation means, and is distinguished by the fact that said excitation means comprise: means for delivering a periodic signal $A_x$ of predetermined duration and applied sequentially to the lines, means for generating periodic signals $A_y$ having the same duration as $A_x$ but having a phase shift $\phi_{ji}$ with respect to $A_x$, said signal $A_y$ being applied to the line $y_j$, and means for causing values of said phase shifts $\phi_{ji}$ to correspond to any value G of an input quantity to be displayed.

In a preferred alternative form of construction of said imager, the means for generating the signal $A_y$ comprise means for simultaneously generating the $p$ signals which are intended to excite in parallel the $p$ zones of any one column.

In this alternative form of construction and in accordance with two preferred embodiments, the imager can comprise either means for quantizing the input signal and giving corresponding discrete values to the phase shift $\phi_{ji}$ or means for carrying out analog conversion of the input signal into a phase shift.

The properties and advantages of this invention will in any case become more readily apparent from the following description of practical examples which are given by way of explanation without any limitation being implied. For the sake of enhanced clarity, the description relates to the control of the optical index of a liquid crystal under the action of an applied electric field. As stated earlier, the invention is much broader in scope but it is preferable to base the description on this example since these liquid crystal devices are at present well known and widely employed. The liquid crystal adopted hereinafter by way of example and not in any limiting sense will be of the nematic type known as methoxy-benzylidene-butylaniline and designated as MBBA.

Reference will be made in the description to the accompanying drawings, in which.

Figure 1:
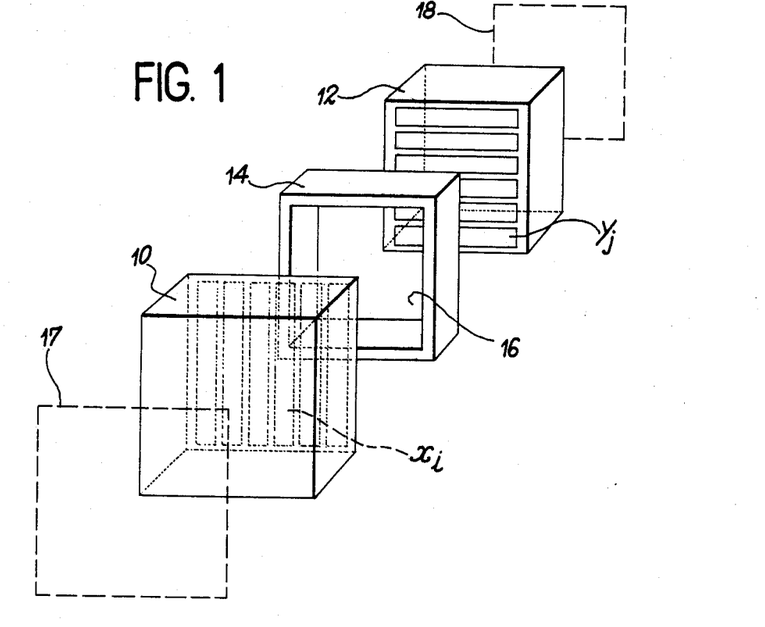
FIG. 1 is an exploded view in perspective showing a liquid crystal cell which makes use of crossbar electrodes.

FIG. 1 illustrates a crossbar display cell. This cell has two walls 10 and 12 which are usually transparent and placed on each side of a spacer element 14 of insulating material defining a space 16 which, when the cell is mounted, is occupied by the material having an optical characteristic to be controlled such as a liquid crystal film, for example. On the walls 10 and 12 are deposited two systems of electrodes each constituted by a series of semitransparent conductive parallel strips or so-called bars denoted by $x_i$ in the case of the columns and by $y_j$ in the case of the lines. The useful surface area of the liquid crystal is thus split up into a mosaic of zones corresponding to the zones of overlapping of the two electrode systems; each zone is intended to correspond to the overlapping portion of two bars $x_i$ and $y_j$ and can accordingly be designated by the notation $x_iy_j$. The sensitization of a zone or in other words the control of an optical characteristic of the liquid crystal contained within said zone takes place by applying to the electrodes $x_i$ and $y_j$ voltages which produce an electric field within the liquid crystal. An image is thus caused to appear on the entire cell and defined point by point while sensitizing the zones one after the other in accordance with known principles of sequential control.

The general principle of the phenomenon employed in a liquid crystal cell in which use is made of a liquid crystal of nematic type such as MBBA can now be explained very briefly in order to gain a clearer understanding of the invention.

The MBBA molecule possesses an electric dipole moment which is perpendicular to its long axis. When no electric field is applied, the walls of the cell containing the liquid crystal (for example the walls 10 and 12 of the cell shown in FIG. 1) are treated so as ensure that the molecules are perpendicular to said walls. The application of an electric field within the liquid crystal modifies the orientation of the dipole moment, with the result that the molecules are laid parallel to the electrodes. This collective orientation of the molecules induces a birefringence $\Delta n$ in the liquid crystal film. This birefringence is dependent on the amplitude of the signals applied and on the duration of these latter in accordance with characteristics which are known to those versed in the art but is also dependent, as will be explained later and in accordance with the essential feature of the invention, on the phase shift between the applied signals.

In order to read the indices of the different sensitized zones of the cell, this latter can be placed between an analyzer and a polarizer which are represented very diagrammatically by the elements 17 and 18 and serve to convert an index difference $\Delta n$ within a thickness $d$ of material into a luminous intensity which is proportional to $\sin^2 \pi \Delta nd/\lambda$, where $\lambda$ is the wavelength of the radiation employed; the planes of polarization of the polarizer and of the analyzer are crossed and located at 45° with respect to the principal critical axes of the imager.

More precisely, the birefringence $\Delta n$ exhibited by a nematic liquid crystal zone is related to the potential difference V applied between the electrodes by a relation of the form:

$$\Delta n = \Delta n_{\infty} \exp (A V^2) \qquad (1)$$

where $\Delta n_{\infty}$ is the value of the birefringence corresponding to the thermal agitation and where A represents a constant which is dependent on the liquid crystal employed and on the duration of the excitation pulses. V represents the sum of the different voltages applied to a zone during the display.

Figure 2:
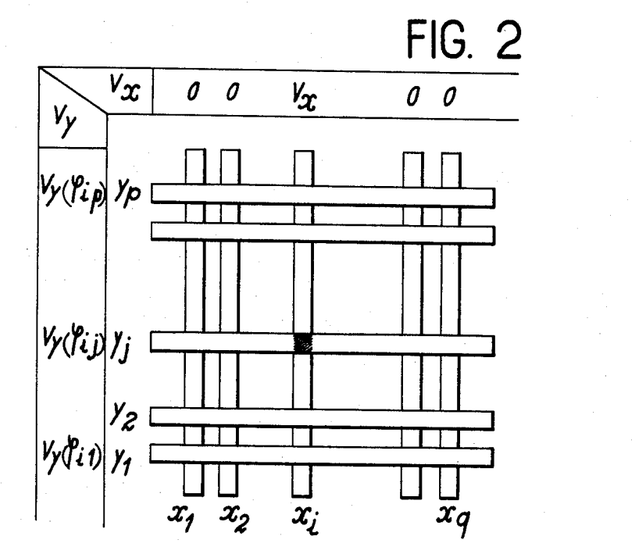
FIG. 2 illustrates the method of excitation in accordance with the invention by showing the different voltages applied to the electrodes of a crossbar cell.

FIG. 2 illustrates the method of control according to the invention. This figure shows diagrammatically $q$ columns $x_i$ and $p$ lines $y_j$. In order to sensitize the zone $x_iy_j$, a voltage $V_x$ is applied to the column $x_i$ and a zero voltage is applied to the other columns. There are applied to the lines $y_j$ voltages $V_{yj}(\phi_{ji})$ which have the same duration and the same frequency as the voltage $V_x$ but are displaced in phase with respect to this latter by a quantity $\phi_{ji}$.

The birefringence $\Delta n$ of the liquid crystal in the zone $x_iy_j$ then becomes a function of the phase shift $\phi_{ji}$ between the excitation voltages applied to the column $x_i$ and the line $y_j$.

The phenomenon employed in an imager of this type is the collective orientation of the molecules by action of an electric field on their dipole moment. In order to prevent any disturbance in the liquid which might arise in particular from ion transits, the excitation voltage must have a zero mean value and a frequency which is higher than a charge relaxation frequency within the liquid. The voltage applied to the electrodes can therefore have either a rectangular or sinusoidal waveform, for example.

In the case of rectangular control signals having amplitudes $V_x$ and $V_y$ and a relative phase shift $\phi$, the birefringence $\Delta n$ becomes a function of $\phi$ which follows from relation 1 given above, viz:

$$\Delta n (\phi) = \Delta n_{\infty} \exp A [(V_x + V_y)^2 - (4\phi/\pi) V_xV_y + (q-1) V_y^2] \qquad (2)$$

If the control signals are sinusoidal and have rms values $V_x$ and $V_y$, the law of variation of the birefringence as a function of $\phi$ takes the form:

$$\Delta n (\phi) = \Delta n_{\infty} \exp A [(V_x + V_y)^2 - 4\sin^2(\phi/2) V_xV_y + (q-1) V_y^2] \qquad (3)$$

In these relations, the term $\exp [A(q-1)V_y^2]$ is derived from the application of the voltage $V_y$ (irrespective of its phase) to the lines and from the application of a zero voltage to the columns (non-selected column); the accumulation effect is the same irrespective of the image displayed.

Referring to formula 2 which gives the birefringence as a function of the phase shift in the case of rectangular control signals, it is apparent that this birefringence varies between a value $\Delta n_1$ which is obtained in respect of $\phi = 0$ and a value $\Delta n_0$ which is obtained in respect of $\phi = \pi$, the expressions of these values being respectively:

$$\Delta n_1 = \Delta n_{\infty} \exp [(V_x+V_y)^2 + (q-1) V_y^2]$$

$$\Delta n_0 = \Delta n_{\infty} \exp [(V_x-V_y)^2 + (q-1) V_y^2]$$

In the case of a cell intercalated between an analyzer and a polarizer in cross relation, the birefringence $\Delta n_1$ obtained in respect of $\phi_{ij}=0$ corresponds to the display of a bright zone, and the birefringence $\Delta n_0$ obtained in respect of a phase shift $\phi_{ij} = \pi$ corresponds to a dark zone. If the display contrast is defined as being the ratio of luminous intensity of a bright zone to the intensity of a dark zone taken as a reference, this contrast can assume the maximum value $C_{max}$ defined by:

$$C_{max} = \frac{1}{\sin^2 (\frac{\pi}{2} \frac{\Delta n_0}{\Delta n_1})}$$

This maximum contrast depends on the number $p$ of lines. The contrast $C(\phi)$ in the case of a zone having any degree of brightness is accordingly made dependent on $\phi$ by the relation:

$$C(\phi) = \frac{\sin^2 \frac{\pi}{2} \frac{\Delta n}{\Delta n_1}}{\sin^2 \frac{\pi}{2} \frac{\Delta n_0}{\Delta n_1}} = C_{max} \sin^2 \frac{\pi}{2} \frac{\Delta n}{\Delta n_1} = C_{max} \sin^2 \left[ \frac{\pi}{2} \left( \frac{\Delta n_0}{\Delta n_1} \right)^{\phi/\pi} \right]$$

in respect of $\phi = 0$ $\Delta n (\phi) = \Delta n_1$ and $C(\phi) = C_{max}$ and in respect of $\phi = \pi$ $\Delta n (\phi) = \Delta n_0$ and $C(\phi) = 1$.

Thus the method according to the invention makes it possible to adjust the contrast solely by producing action on a phase shift, the amplitudes and durations of the excitation signals being maintained constant.

Said amplitudes and durations can be determined by the method disclosed in a French patent application filed by the present applicant under No. EN 7230685 on Aug. 29th, 1972 in respect of "Method for controlling an optical characteristic of a crystal and devices for carrying out said method". In order to control the optical characteristic of a point, the method aforesaid consists in applying high voltages during a limited period of time while taking into account the transient response of the effect employed. The durations and amplitudes of the signals $V_x$ and $V_y$ can therefore be selected in accordance with said method.

In the mode of excitation illustrated in FIG. 2, the maximum contrast $C_{max}$ defined in the foregoing is dependent on the number $q$ of columns. The contrast $C(\phi)$ which assumes said maximum value in respect of $\phi = 0$ is therefore also dependent on the parameter $q$ or alternatively on the value of $C_{max}$ if this is considered preferable.

Figure 3:
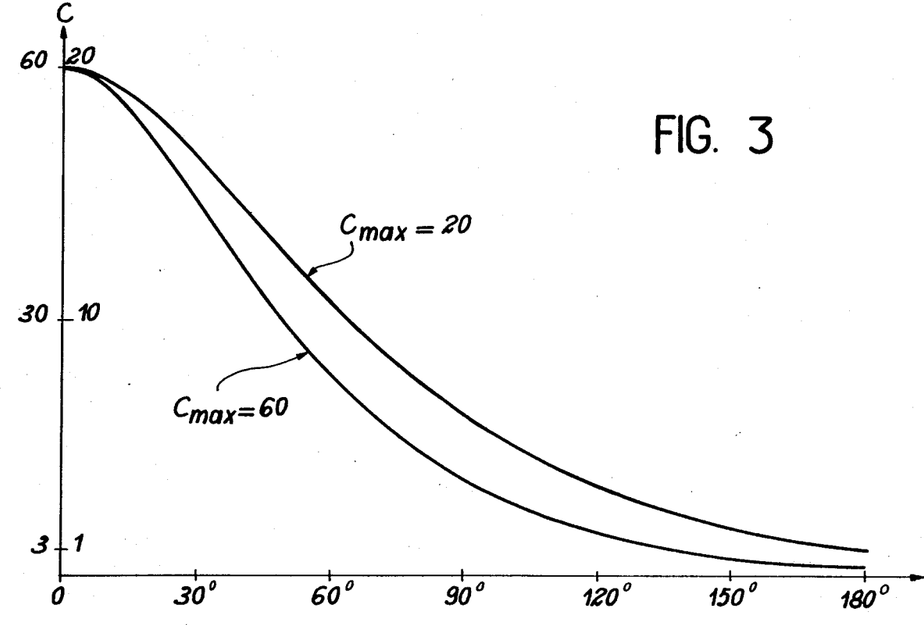
FIG. 3 represents two curves $C(\phi)$ of variation of the contrast C obtained as a function of the phase shift $\phi$ in respect of two values of the number of lines of the display cell.

FIG. 3 shows by way of explanation the variations in contrast C as a function of $\phi$ in the case of two values of maximum contrast. These values correspond respectively to an imager of 32 and of 16 columns, thus resulting in a maximum contrast respectively of 20 and of 60. Each curve of FIG. 3 therefore makes it possible to determine the phase shift which must be employed between the excitation signals for the lines and the columns of an imager having either 32 or 16 lines in order to obtain a predetermined contrast.

The analog imager which is provided by the invention and serves to carry out this method comprises excitation means which deliver voltages $V_x$ and $V_y$ (or more generally signals $A_x$ and $A_y$), the phase shift $\phi$ of which is related to the input quantity to be displayed by a function whose variations can be represented by a curve which is similar to those represented in FIG. 3.

Without any limitation being implied, there will now be described two particular forms of construction of an imager of this type, one being based on quantization of the input signal to be indicated and the other being based on a continuous analog conversion. In these two alternative forms, the means for generating the voltage $V_y$ can advantageously comprise means for simultaneously generating the $p$ voltages which are intended to excite in parallel the $p$ zones of one and the same column $x_i$. The block diagrams of the excitation means are represented by FIGS. 4 and 5 respectively in the case of these two alternative forms of construction.

Figure 4:
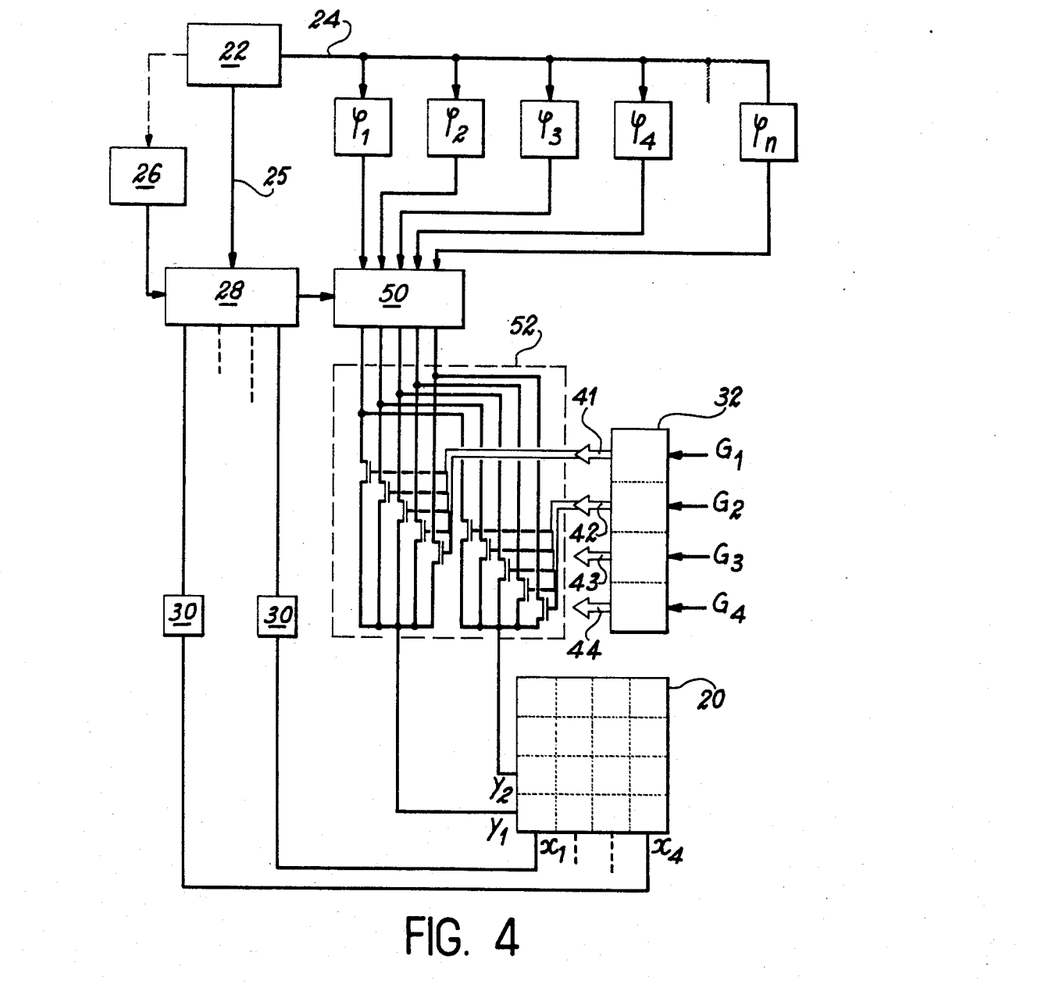
FIG. 4 is a block diagram showing a first form of construction of the means for controlling an analog imager in accordance with the invention.
Figure 5:
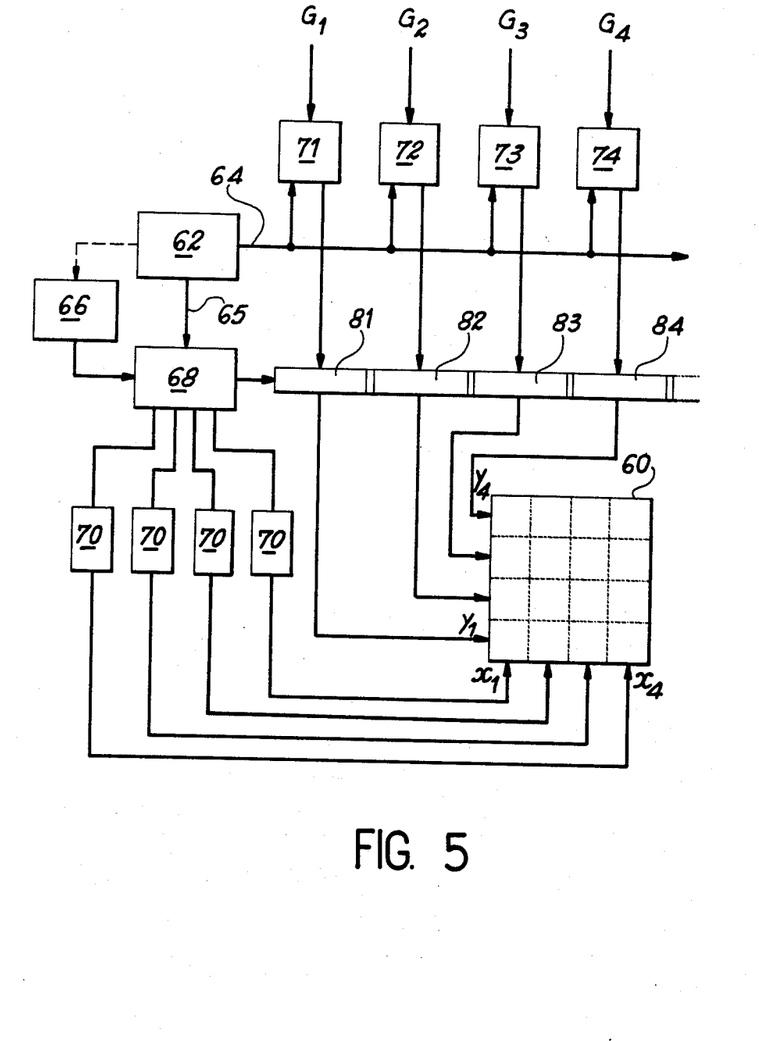
FIG. 5 is a block diagram showing a second form of construction of the means for controlling an analog imager.

Solely by way of explanation, the cell 20 shown in FIG. 4 comprises four columns designated by the references $x_1, x_2, x_3, x_4$ and four lines $y_1, y_2, y_3, y_4$ which are connected to excitation means constituted by:
— an oscillator 22 for delivering a reference signal at its outputs 24 and 25,
— a clock 26 which defines the sequences of application of the excitation signals,
— a sequence-generating circuit 28 which is controlled by the clock 26, to which the reference signal is applied via the connection 25, and which delivers sequentially at its four outputs a voltage $V_x$ of predetermined duration, the amplitude of which can be adjusted by means of amplifiers 30 connected to the four columns of the display cell 20,
— a quantization circuit 32 for the input quantity G to be displayed: said circuit has $n$ quantization levels (corresponding to $n$ grey levels) and receives in parallel groups of four values $G_1, G_2, G_3, G_4$ of the input quantity which it is desired to display simultaneously on the four zones of one column of the cell 20. Said circuit 32 comprises four parallel outputs 41, 42, 43 and 44 each having $n$ connections, the output 41 being intended to carry the quantized value $G_1$ which must be recorded on the line $y_1$, the output 42 being intended to carry the quantized value $G_2$ which must be recorded on the line $y_2$ and so forth,
— $n$ phase-shifting circuits $\phi_1, \phi_2, \phi_3 \ldots {}_n$ to which the reference signal is applied via the connection 24 and which delivers $n$ signals displaced in phase with respect to said reference signal by $n$ discrete values between 0 and $\pi$, said $n$ values of the phase displacement being related to the $n$ quantization levels which characterize the circuit 32 by the law $C(\phi)$ which relates the contrast obtained in the cell 20 to the phase shift between the excitation signals,
— a chopper circuit 50 for receiving in parallel the $n$ phase-shifted signals derived from the phase shifters $\phi_1 \ldots \phi_n$, which is controlled by the sequence generator 28 and delivered simultaneously at $n$ parallel outputs voltages $V_y$ having a duration equal to that of $V_x$,
— a switching circuit 52 having $n$ parallel inputs, four groups of $n$ control lines and four parallel outputs, the $n$ inputs being connected to the $n$ outputs of the circuit 50, the four groups of $n$ control lines being connected to the outputs 41 to 44 of the circuit 32 and the four outputs being each connected to one of the four lines of the cell 20.

The operation of a circuit of this type is as follows: taking into account the characteristics of the liquid crystal employed, the geometry of the cell and the number $q$ of columns of the cell, it is possible to deduce therefrom the law $C(\phi)$ which relates the contrast to the phase shift between the excitation signals. From this law, there are deduced the $n$ values of the phase shift corresponding to the $n$ levels of quantization required for quantizing the maximum value of the input quantity to be displayed. The sequence generator 28 defines the duration of the excitation signals in the columns and, by means of the chopper circuit 50, the duration of the signals applied to the lines. The amplifiers 30 serve to adjust the amplitude of the signals applied to the columns. In order to apply to a given line of the cell the voltage $V_y$ which has the appropriate value by way of phase shift, said line of the cell is connected to the appropriate output of the circuit 50 by means of the switching circuit 52. This circuit comprises switches, for example, and each switch serves to connect each line to any one of the $n$ outputs of the circuit 50. These switches are represented in FIG. 4 by field-effect transistors but can be of any suitable type.

There corresponds to any input quantity $G_1$, $G_2$, $G_3$ or $G_4$ a quantized output signal which is conducted to the corresponding output of the circuit 32 and can, for example, be formed by a signal which appears on one of the $n$ leads of said output. Said signal is applied to the gate of the transistor and triggers this latter into conduction, thereby connecting the line of the cell to the appropriate output of the chopper circuit 50.

It is wholly apparent that the number of bars is not limited to twice four but can have any desired value. The number $n$ of quantization levels can also be as desired. By way of example, the present Applicant has constructed an imager in which the cell had 32 lines and 32 columns, which corresponded to a maximum contrast of 20 and in which the quantization circuit operated with sixteen quantization levels. The sixteen values of the phase shift are determined with the aid of the curve $C_{max} = 20$ of FIG. 3. For example, in the case of 16 uniformly spaced levels, the values of the angles $\phi$ are respectively as follows:
180° — 141° — 119.5° — 104.1° — 92° — 82° — 73.1° — 65.2° — 57.9° — 51.1° — 44.4° — 37.9° — 31.5° — 24.3° — 15.9° — 0°.

It is naturally apparent that these levels are not necessarily spaced in a uniform manner. In some applications, it can be an advantage to ensure that some portions are expanded and other portions are contracted. A coding of this type can be compensated by reverse coding at the time of reading.

There is shown in FIG. 5 a block diagram of a second form of construction of the imager according to the invention in which the input quantity is processed by the analog method. In this alternative form, the imager comprises a display cell 60 which is similar to the cell 20 of the preceding figure and which is assumed solely by way of explanation to comprise four lines and four columns. The excitation means comprise:
— an oscillator 62 for delivering a reference signal at its outputs 64 and 65;
— a clock 66 for defining the sequences of application of the excitation signals;
— a sequence-generating circuit 68 controlled by the clock 66; the reference signal carried by the lead 65 is applied to said circuit and voltages $V_x$ having predetermined durations are delivered sequentially at the four outputs of said circuit, the amplitude of said voltages being adjusted by means of the amplifiers 70, the outputs of which are connected to the four columns of the cell 60;
— a group of four phase-shifting circuits 71, 72, 73 and 74 connected in parallel to which the reference signal is applied via the lead 64 and which deliver four signals displaced in phase by suitable quantities. These phase shifters are of the analog type for establishing a correspondence between any input quantity ($G_1$, $G_2$, $G_3$ and $G_4$) and the phase shifts ($\phi_1$, $\phi_2$, $\phi_3$, $\phi_4$) which are related analogically to the quantity G by means of the known law $C(\phi)$;
— four chopper circuits 81, 82, 83 and 84 connected in parallel and synchronized by the sequence generator 68; these circuits receive the phase-shifted signals derived from the analog phase shifters 71 to 74 and deliver at their outputs four voltages $V_y$ having a duration equal to that of the voltages $V_x$. Said outputs are connected to the four lines $y_1$, $y_2$, $y_3$, $y_4$ of the cell 60.

The operation of said circuit immediately follows from the operation of the circuit shown in FIG. 4 except for the fact that the appropriate phase shift between the excitation voltages is determined by the phase shifters 71 to 74.

In the two alternative forms of construction illustrated in FIGS. 4 and 5, the clocks 26 and 66 can be synchronized with the oscillators 22 and 62 (the connections between the two circuits being shown in dashed lines) and the sequence generators 28 and 68 can be constituted by shift registers.

What we claim is:

1. A method for controlling an optical characteristic of a material which is intercalated between two electrodes driven by periodic excitation signals having a zero mean value, wherein said method consists of applying to said electrodes, signals having the same time-duration and the same recurrence frequency but in which one signal has a phase shift $\phi$ with respect to the other and wherein said phase shift is modified to any values between 0 and $\pi$ in order to adjust said characteristic to correspond to any value G of an input quantity to be displayed.

2. A method according to claim 1 for a sequential control of an optical characteristic of a material constituting a plurality of zones arranged in a matrix and intercalated between a first family of $p$ parallel control lines and a second family of $q$ parallel control columns, the lines and the columns being in crossed relation, a zone $x_i y_j$ being defined by that region of the material which is covered by the column $x_i$ where $i$ is an integer $1 \leq j \leq q$ and by the line $y_j$ where $j$ is an integer $1 \leq j \leq p$, said lines and columns being employed to carry suitable signals for producing excitation of the material, wherein said method consists for the purpose of controlling said optical characteristic of the material of the zone $x_i y_j$ at a value C in applying a signal $A_x$ to the column $x_i$ and a zero signal to the other columns and in applying to the line $y_j$ a signal $A_y$ having twice the duration and the same frequency equal to that of signal $A_x$ and wherein said phase shift is modified in order to adjust said optical characteristic of the material within the zone $x_i y_j$ to said value C.

3. A method according to claim 2, wherein said characteristic is an even-numbered function of the excitation.

4. A method according to claim 2, wherein said method consists in controlling simultaneously the value of the optical characteristic of all the zones of a given column $x_i$ by applying simultaneously to each line the signal $A_y$ which corresponds thereto.

5. A method according to claim 2, wherein the signals $A_x$ and $A_y$ are rectangular signals having a zero mean value.

6. A method according to claim 2, wherein the signals $A_x$ and $A_y$ are sinusoidal signals having a zero mean value.

7. A method according claim 1, wherein said material is a liquid crystal film in which one optical characteristic is dependent on an electric field applied thereto, said excitation signals being voltages.

8. A method according to claim 7, wherein said liquid crystal has a birefringence induced by an effect of collective orientation of its molecules and wherein said optical characteristic is said birefringence.

9. A method for controlling an analog imager of the crossbar type comprising a matrix of zones in which one optical characteristic is controlled in accordance with the method of claim 2, said characteristic C being related to said phase shift $\phi$ by a law C ($\phi$) wherein, in order to ensure that the characteristic C displayed in zone $x_i y_j$ is an analog function of a value G of an input quantity assuming an amplitude which has a maximum, the following operations are performed:

dividing the maximum amplitude which can be assumed by the input quantity into $n$ quantization levels, taking account of said law C ($\phi$) which relates the value of the characteristic C of the material to the phase shift $\phi$ between the excitation signals, forming $n$ discrete values of the phase shift $\phi$ between 0 and $\pi$ corresponding to the $n$ quantization levels, forming by means of a periodic reference signal $A_r$, $n$ phase-shifted signals $A_y$ of said $n$ discrete values of $\phi$, causing to correspond to each value of the input quantity a signal $A_y$ which is phase-shifted with respect to $A_r$ by the appropriate value $\phi$, said signal being applied to the line $y_j$, applying said reference signal $A_r$ to the column $x_i$.

10. A method according to claim 2 for controlling an analog imager of a crossbar type comprising a matrix of zones said material having an optical characteristic which is related to the phase shift $\phi$ between the excitation signals by the law C ($\phi$) wherein, in order to ensure that said optical characteristic C displayed in a zone $x_i y_j$ covered by column $x_i$ and line $y_j$ is an analog function of the value G of an input quantity, the following operations are performed:

generating a periodic reference signal $A_r$, generating in respect of each value of the input quantity a signal $A_y$ ($\phi$) which is phase-shifted with respect to the signal $A_r$ by a value $\phi$ which is determined by said known law C ($\phi$), applying said reference signal $A_r$ to the column $x_i$, applying said signal $A_y$ ($\phi$) to the line $y_j$.

11. An analog imager for controlling an optical characteristic of a material, comprising a display cell constituted by said material intercalated between two electrodes driven by periodic excitation signals, said material being such as to have an optical characteristic which is dependent on said excitation, and comprising means for delivering said excitation signals to said electrodes, wherein said means comprise means for delivering excitation signals having equal recurrence frequency and equal duration but having a phase shift $\phi$ with respect to each other and means for modifying said phase shift to any values between 0 and $\pi$ inorder to adjust said characteristic to correspond to any value G of an input quantity to be displayed.

12. An analog imager according to claim 11, of the type comprising a plurality of zones arranged in a matrix and intercalated between a first family of $p$ parallel control lines and a second family of $q$ parallel control columns, the lines and the columns being in crossed relation, and overlapping a zone $x_i y_j$ being defined by the overlapping of a column $x_i$ where $i$ is an integer between 1 and $q$ and of a line $y_j$ where $j$ is an integer between 1 and $p$, said lines and columns being connected to suitable sequential excitation means, wherein said excitation means comprise: means for delivering a periodic signal $A_r$ of predetermined duration and applied sequentially to the lines, means for generating a periodic signal $A_r$ having a same duration as $A_r$ but having a phase shift $\phi$ with respect to $A_r$, said signal $A_y$ being applied to the line $y_j$, and means for causing a value of said phase shift $\phi$ to correspond to any value G of an input quantity to be displayed.

13. An imager according to claim 12, wherein the means for generating the signal $A_y$ comprise means for simultaneously generating $p$ signals which excite in parallel $p$ zones of any one column $x_i$.

14. An imager according to claim 13, wherein said excitation means comprise:

an oscillator for delivering a reference signal, a clock for defining sequences of application of the excitation signals, a sequence-generating circuit controlled by said clock to which the reference signal is applied and which delivers sequentially to $q$ outputs a signal $A_r$ having a predetermined amplitude and duration, each of the $q$ outputs being connected to one of the $q$ columns of the imager, a circuit for quantizing the input quantity having $n$ quantization levels and receiving in parallel groups of $p$ values of the input quantity to be displayed simultaneously on the $p$ zones of any one column and comprising $p$ groups in parallel each having $n$ outputs, the group of outputs having the index $j$ being intended to carry the quantized value of the input quantity to be displayed on the line $y_j$ of the column $x_i$, $n$ phase shifters for receiving said reference signal and delivering $n$ signals which are phase-shifted with respect to the reference signal by $n$ discrete values between 0 and $\pi$, said phase-shift values being related to the $n$ quantization levels by the law C ($\phi$) which relates the value of the characteristic C of the material to the phase shift $\phi$ between the excitation signals, a chopper circuit to which the $n$ phase-shifted signals are applied in parallel, which is controlled by said sequence generator and delivers simultaneously at $n$ parallel outputs signals $A_y$ having a duration equal to that of the signal $A_r$, a switching circuit having $n$ parallel inputs, $p$ groups of $n$ control lines and $p$ parallel outputs, the $n$ inputs being such as to receive the $n$ values of $A_y$ carried by the $n$ outputs of the chopper circuit, the $p$ groups of $n$ control lines being connected to the $p$ groups of $n$ lines of the circuit for quantization of the input quantity, each of the $p$ outputs being connected to one of the $p$ lines of the imager.

15. An imager according to claim 13, wherein said excitation means comprise:

an oscillator for delivering a reference signal, a clock for defining the sequences of application of the excitation signals, a sequence-generating circuit controlled by said clock to which the reference signal is applied and which delivers sequentially at $q$ outputs a signal $A_r$ having a predetermined amplitude and duration, each of the $q$ outputs being connected to one of the $q$ columns of the imager, $p$ analog phase-shifting circuits for receiving the reference signal and delivering $p$ phase-shifted signals by suitable quantities determined by the law C ($\phi$), $p$ chopper circuits in parallel synchronized by the sequence generator which each receive one of the $p$ phase-shifted signald and deliver at $p$ outputs $p$ signals $A_y$ having a duration equal to that of the signal $A_r$, each of the $p$ outputs being connected to one of the $p$ lines of the imager.

16. An imager according to claim 11 wherein said material is a nematic liquid crystal.

* * * * *